(12) United States Patent
Monceau

(10) Patent No.: US 6,246,261 B1
(45) Date of Patent: Jun. 12, 2001

(54) CIRCUIT FOR DETECTING THE DISAPPEARING OF A PERIODIC SIGNAL

(75) Inventor: Laurent Monceau, Eybens (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/374,068

(22) Filed: Aug. 12, 1999

(30) Foreign Application Priority Data

Aug. 13, 1998 (FR) .................................................. 98 10480

(51) Int. Cl.[7] .................................................. G01R 29/02
(52) U.S. Cl. .............................................. 326/46; 327/48
(58) Field of Search ................................ 326/46; 327/18, 327/20, 47, 48, 49

(56) References Cited

U.S. PATENT DOCUMENTS

| 4,311,962 | 1/1982 | Titsworth | 328/120 |
|---|---|---|---|
| 4,622,481 | * 11/1986 | Nortrup | 307/522 |
| 4,914,680 | * 4/1990 | Tanno et al. | 377/49 |
| 5,138,636 | * 8/1992 | Bardin | 375/108 |

FOREIGN PATENT DOCUMENTS

| 01288914 | 11/1989 | (JP) | G06F/1/04 |
|---|---|---|---|
| 04306930 | 10/1992 | (JP) | H04L/7/00 |
| 08316946 | 11/1996 | (JP) | H04L/7/00 |

* cited by examiner

*Primary Examiner*—Michael Tokar
*Assistant Examiner*—Don Plu Le
(74) *Attorney, Agent, or Firm*—Theodore E. Galanthay; E. Russell Tarleton; Seed IP Law Group PLLC

(57) ABSTRACT

A circuit for detecting the disappearing of a periodic input signal, the circuit including a frequency divider receiving the input signal, the frequency divider having two complementary outputs combined with a same reference signal of same frequency as the input signal by means of two respective similar logic gates, the output of a first one of the logic gates being connected to increment a first counter and to reset a second counter similar to the first one, and the output of the second logic gate being connected to increment the second counter and to reset the first counter, and a logic circuit generating a disappearing detection signal when any one of the two counters reaches a predetermined value.

19 Claims, 2 Drawing Sheets

CIRCUIT FOR DETECTING THE DISAPPEARING OF A PERIODIC SIGNAL

FIELD OF THE INVENTION

The present invention relates to a circuit for detecting the disappearing of a signal, especially of a periodic logic signal.

BACKGROUND OF THE INVENTION

Many electronic devices use for their operation one or several periodic logic signals, for example to synchronize a phase-locked loop or to be used as clock signals. For different reasons, the periodic input signal provided to a device may disappear and cause a malfunction of the device. Further, in some cases, when for example a CRT control device receives a periodic horizontal synchronization signal to generate control signals for the tube deviator, the disappearing of the horizontal synchronization signal can result in the generation of inappropriate control signals and the destruction of the deviator.

When such periodic signals are compulsory for some devices, a conventional solution consists of very clearly specifying in the technical instructions of the devices which signals must imperatively be provided during operation to avoid damage.

Although it is always possible to use this solution, it is preferable to detect the disappearing of the periodic logic input signal that can cause a serious malfunction and, as soon as this detection is achieved, to modify the device operation to avoid any risk of damage.

Further, it is very important to be able to perform this detection very fast, to limit damage that may occur between the signal disappearing and the detection of this disappearing.

SUMMARY OF THE INVENTION

The present invention provides a circuit enabling fast detection of the disappearing of a signal, and in one embodiment, for detecting the cessation of a periodic logic input signal.

The circuit for detecting the disappearing of a periodic input signal includes a frequency divider receiving the input signal, having two complementary inputs combined with a same reference signal of same frequency as the input signal by means of two respective similar logic gates, the output of a first one of the logic gates being connected to increment a first counter and to reset a second counter similar to the first one, and the output of the second logic gate being connected to increment the second counter and to reset the first counter, wherein a logic circuit generates a disappearing detection signal when any one of the two counters reaches a predetermined value.

According to an embodiment of the invention, the frequency divider is a divider by two.

According to an embodiment of the invention, the logic gates are AND gates.

According to an embodiment of the invention, the counters are shift registers, each including three series-connected D flip-flops, and the logic circuit is an OR gate connected to the output of the third flip-flop of each of the two counters.

BRIEF DESCRIPTION OF THE DRAWINGS

The foregoing and other features and advantages of the present invention, will be discussed in detail in the following non-limiting description of specific embodiments in connection with the accompanying drawings.

DETAILED DESCRIPTION OF THE INVENTION

Figure 1:
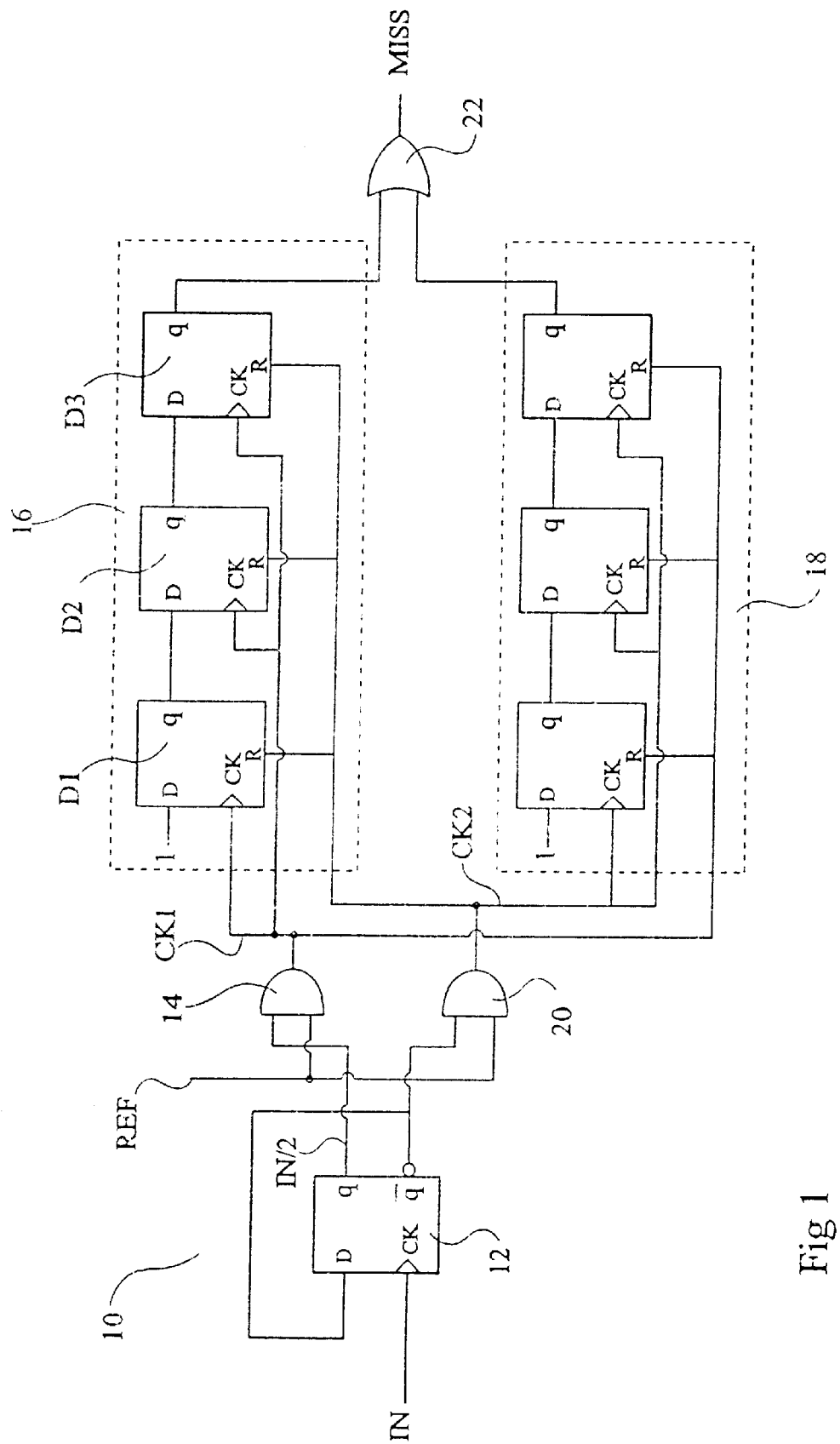
FIG. 1 shows an embodiment of a circuit for detecting the disappearing of an input signal according to the present invention.

FIG. 1 shows a detection circuit 10 receiving a periodic logic input signal IN and a periodic logic reference signal REF having the same frequency as the input signal. Signal REF can for example be generated at the output of a phase-locked loop synchronized on signal IN. The phase existing between signals IN and REF can have any value, and the duty cycle of signal REF is of no importance.

The frequency of input signal IN is divided by two by a divider 12 including a D-type flip-flop, the data input D of which is connected to its complemented output $\overline{Q}$. A first internal signal CK1 is generated by an AND gate 14, a first input of which receives the direct output Q of flip-flop 12 and a second input of which receives reference signal REF.

Signal CK1 rates a first shift register 16 with its rising edges. This shift register includes three series-connected D-type flip-flops (D1, D2, D3), each provided with a reset terminal R. The reset terminals R of the three flip-flops are interconnected, and the first flip-flop D1 permanently receives a 1 on its data input D. Signal CK1 is also provided to reset terminals R of the flip-flops of a second shift register 18 similar to register 16.

A second internal signal CK2 is generated by an AND gate 20, which receives on a first input the complemented output $\overline{Q}$ of flip-flop 12 and on a second input reference signal REF. Signal CK2 rates shift register 18 with its rising edges, and resets register 16. The outputs of registers 16 and 18 are both provided to an OR gate 22 which provides a signal MISS of detection of a disappearing.

Figure 2:
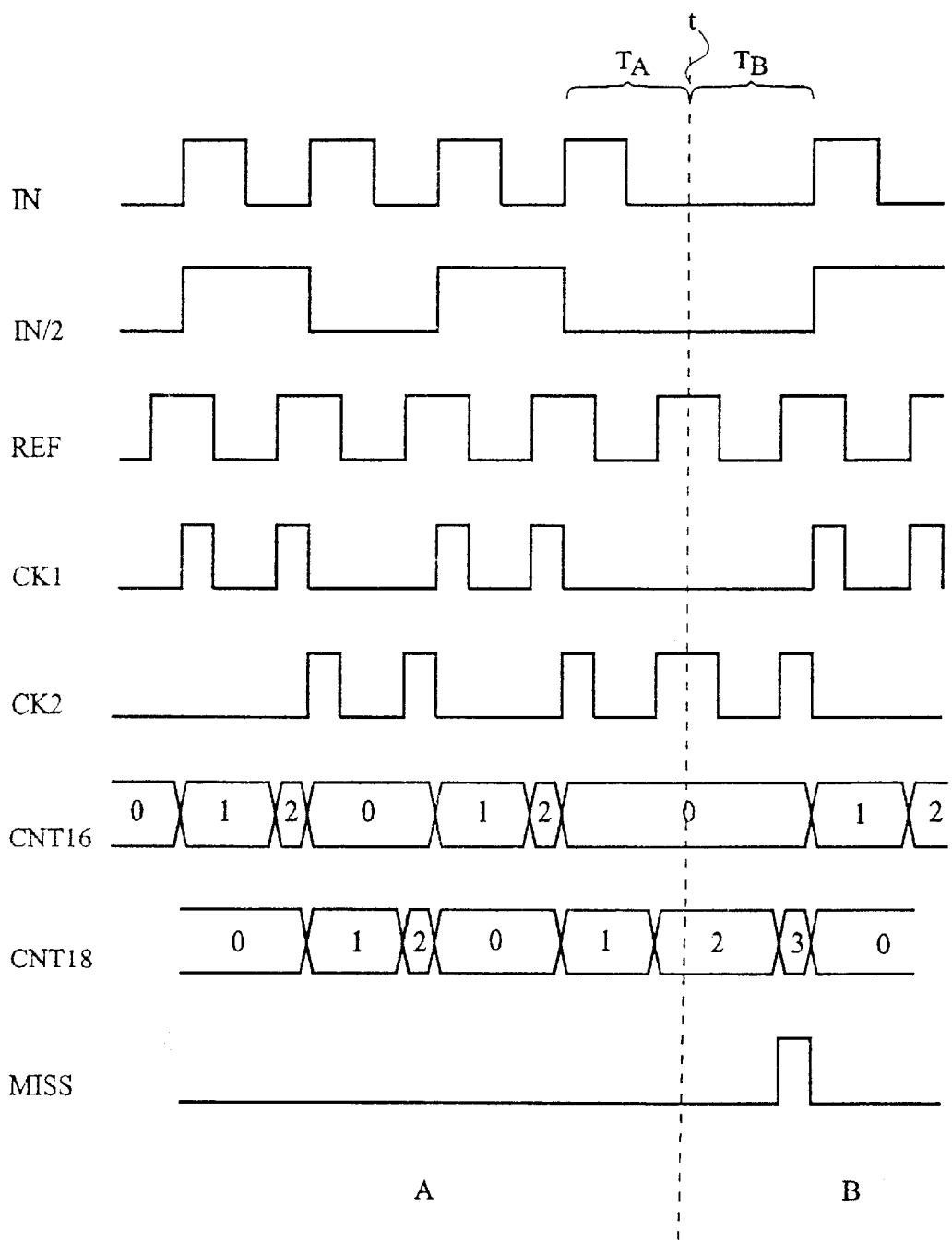
FIG. 2 shows a timing diagram illustrating the operation of the circuit of FIG. 1.

FIG. 2 shows in a left-hand portion A of a timing diagram the normal operation of circuit 10, when the latter receives input signal IN and reference signal REF. Flip-flop 12 generates on its output Q a signal IN/2 of frequency twice lower than that of input signal IN. Signal CK1 corresponds to the logic AND combination of signal IN/2 and of reference signal REF. Similarly, signal CK2 corresponds to the logic AND combination of the signal complementary of IN/2 generated by output $\overline{Q}$ of flip-flop 12 (not shown) and of reference signal REF. Value CNT16 represents the number of D flip-flops at 1 of shift register 16. Each rising edge of signal CK2 resets all the D flip-flops of register 16. Each rising edge of internal signal CK1 propagates state 1 by one flip-flop in register 16, that is, increments by 1 the number of D flip-flops at 1.

When input signal IN is present, two rising edges of signal CK1 at most are provided to register 16 before a rising edge of signal CK2 resets the register. Thus, the number of D flip-flops of register 16, having an activated output periodically varies between 0 and 2 during each period of signal IN/2. In other words, in normal operation the last flip-flop of register 16 is not set to 1.

Shift register 18 operates in the same way as register 16 with a phase shift equal to one period of input signal IN, value CNT18 represents the number of D flip-flops at 1 in register 18. Accordingly, gate 22 never activates signal MISS, none of the last flip-flops of register 16 and 18 being set to 1.

The right-hand portion B of the block diagram shows the disappearing of signal IN during a period, $T_B$, starting at a time t. The transition of signal IN/2 which should have occurred at t disappears, and signal IN/2 keeps, in the period $T_B$ following the disappearing of the input signal, the value that it had during the preceding period $T_A$. As a result, signal CK1 and signal CK2 are interchanged all along period $T_B$. As a result, signal CK1 does not reset register 18 at the time t when it should have, and register 18 is rated a third time by signal CK2 before being reset. The third flip-flop of register 18 is thus set to 1, and signal MISS of detection of a disappearing is activated.

When signal IN reappears, the circuit operates normally again, register 18 is reset, and signal MISS disappears.

The above-mentioned example illustrates the case where register 18 generates signal MISS, but it should be noted that the case where register 16 generates signal MISS can also be encountered, if signal IN disappears while signal IN/2 is at 1.

The example shown in FIG. 1 enables detecting the disappearing of input signal IN during at east one period. However, it should be noted that an alternative responsive to the disappearing of the input signal after more than one period may also be realized by increasing the number of D flip-flops of shift registers 16 and 18.

It should also be noted that in some phase conditions between signals IN and REF (for example, if they are in phase), registers 16 and 18 will only count to 1 before being reset. In this case, only a disappearing of signal IN of duration greater than or equal to two periods will be detected with the embodiment of FIG. 1. Finally, it should be noted that the disappearing of the signal can leave input IN at a low level (as shown previously) or at a high level.

Of course, the present invention is likely to have various alterations, modifications, and improvements which will readily occur to those skilled in the art. For example, the shift registers may be replaced with other types of counters and the logic OR gate may be replaced with other means for checking that a predetermined value is reached by any one of the two counters. Similarly, AND gates 14 and 20 may be replaced with other logic gates such as OR gates if counters having a reset terminal activated by state 0 are for example desired to be used. The present invention divides the input signal by two to generate internal signals CK1 and CK2 but another type of divider having a different ratio may also be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for detecting the disappearing of a periodic input signal, comprising:
   a frequency divider receiving the input signal, the frequency divider having two complementary outputs that are each combined with a same reference signal of same frequency as the input signal by means of two respective similar logic gates, the output of a first one of the logic gates being connected to increment a first counter and to reset a second counter similar to the first one, and the output of the second logic gate being connected to increment the second counter and to reset the first counter, and a logic circuit coupled to the first and second counter and configured to generate a disappearing detection signal when any one of the two counters reaches a predetermined value.

2. The circuit of claim 1, wherein the frequency divider comprises a divider by two.

3. The circuit of claim 1, wherein the logic gates comprise AND gates.

4. The circuit of claim 1, wherein the counters comprise shift registers including three series-connected D flip-flops (D1, D2, D3), and the logic circuit is an OR gate connected to the output of the third flip-flop of each of the two counters.

5. A circuit for detecting the disappearing of a periodic input signal, comprising:
   a first logic circuit configured to receive the periodic input signal and to output a first periodic output signal and a second periodic output signal that is the complement of the first periodic output signal;
   a second logic circuit having a first logic gate and a second logic gate each having a first input to receive a reference signal and a second input to receive the first and second periodic output signals, respectively, and to output first and second logic output signals, respectively; and
   a third logic circuit having a first circuit and a second circuit configured to each receive the first and second logic output signals from the second logic circuit, and each further configured to generate first and second detection signals, respectively, when the periodic input signal disappears at either a high level or a low level.

6. The circuit of claim 5, further comprising a fourth logic circuit configured to receive the first and second detection signals and to output a disappearing detecting signal when either one or both of the first and second detection signals reaches a predetermined value.

7. The circuit of claim 6 wherein the first logic circuit comprises a frequency divider.

8. The circuit of claim 7 wherein the frequency divider is configured to divide the periodic input signal by two.

9. The circuit of claim 6 wherein the first and second logic circuits each comprise an AND gate.

10. The circuit of claim 9 wherein the first logic circuit comprises a D flip-flop having a complemented output coupled to a D input and a clock input coupled to the periodic input signal.

11. The circuit of claim 6 wherein the first and second circuits of the third logic circuit comprise first and second shift registers, the first logic gate coupled to the first and second shift registers to increment the first shift register and reset the second shift register, and the second logic gate coupled to the first and second shift registers to increment the second shift register and reset the first register.

12. The circuit of claim 11 wherein the first and second shift registers each comprise a series of D flip-flops, each D flip-flop having a clock input and a reset input, the clock input of the D flip-flops in the first register coupled to the first logic circuit and the reset input of the D flip-flops in the first circuit coupled to the second logic circuit, and the clock input of the D flip-flop in the second shift register coupled to the second logic circuit and the reset input of the D flip-flops in the second shift register coupled to the first logic circuit.

13. The circuit of claim 12 wherein the fourth circuit comprises an OR gate.

14. The circuit of claim 5, wherein the first periodic output signal has a lower frequency than the periodic input signal.

15. A method for detecting the disappearing of a periodic input signal, comprising:

receiving a periodic input signal and generating a divided periodic input signal and the complement of the divided periodic input signal;

incrementing a first counter in response to the divided periodic input signal and a reference signal, and resetting the first counter in response to a complement of the divided periodic input signal and the reference signal, and simultaneously incrementing a second counter in response to the complement of the divided periodic input signal and the reference signal and resetting the second counter in response to the divided periodic input signal and the reference signal; and generating a detection signal when either of the first and second counters reaches a predetermined value.

16. The method of claim 15 wherein generating the divided periodic input signal and the complement of the divided periodic input signal comprises inputting the periodic input signal to a frequency divider.

17. The method of claim 15 wherein generating the divided periodic input signal and the complement of the divided periodic input signal comprises inputting the periodic input signal to the clock input of a D flip-flop and receiving the complemented output of the D flip-flop at a D input of the D flip-flop.

18. The method of claim 15 wherein incrementing the first and second counters comprises AND'ing the divided periodic input signal and the reference signal at a first AND gate and coupling the output of the first AND gate to a clock input of a first counter and a reset input of a second counter, and AND'ing the complement of the divided periodic input signal and the reference signal through a second AND gate and coupling the output of the second AND gate to a clock input of the second counter and a reference input of the first counter.

19. The method of claim 18 wherein generating the detection signal comprises ORing the outputs of the first and second counters.

* * * * *